United States Patent
Tsai et al.

(10) Patent No.: US 8,575,754 B2
(45) Date of Patent: Nov. 5, 2013

(54) MICRO-BUMP STRUCTURE

(75) Inventors: Tsung-Fu Tsai, Yunlin County (TW); Tao-Chih Chang, Taoyuan County (TW); Chau-Jie Zhan, Taipei County (TW)

(73) Assignee: Industrial Technology Research Institute, Hsinchu (TW)

( * ) Notice: Subject to any disclaimer, the term of this patent is extended or adjusted under 35 U.S.C. 154(b) by 306 days.

(21) Appl. No.: 12/884,188

(22) Filed: Sep. 17, 2010

(65) Prior Publication Data

US 2011/0156253 A1 Jun. 30, 2011

(30) Foreign Application Priority Data

Dec. 30, 2009 (TW) .............................. 98145816 A

(51) Int. Cl.
*H01L 23/48* (2006.01)
(52) U.S. Cl.
USPC .... 257/773; 257/734; 257/781; 257/E23.019; 257/E23.02; 438/612; 438/614
(58) Field of Classification Search
USPC ......... 257/734, 737, 781, 797, 773, 779, 786, 257/E23.019–E23.021; 438/612–614
See application file for complete search history.

(56) References Cited

U.S. PATENT DOCUMENTS

| | | | |
|---|---|---|---|
| 4,836,435 A | 6/1989 | Napp et al. | |
| 4,940,181 A | 7/1990 | Juskey, Jr. et al. | |
| 5,477,086 A * | 12/1995 | Rostoker et al. | 257/737 |
| 5,525,065 A | 6/1996 | Sobhani | |
| 5,558,271 A | 9/1996 | Rostoker et al. | |
| 5,767,580 A | 6/1998 | Rostoker | |
| 6,415,974 B2 * | 7/2002 | Jao | 228/215 |
| 6,462,426 B1 * | 10/2002 | Kelkar et al. | 257/781 |
| 7,115,997 B2 * | 10/2006 | Narayan et al. | 257/769 |
| 7,135,771 B1 | 11/2006 | Khandekar et al. | |
| 7,482,199 B2 | 1/2009 | Khandekar et al. | |
| 2002/0111009 A1 | 8/2002 | Huang et al. | |
| 2008/0315433 A1 | 12/2008 | Chen et al. | |

FOREIGN PATENT DOCUMENTS

CN 1503328 6/2004

OTHER PUBLICATIONS

"First Office Action of China Counterpart Application", issued on Jun. 19, 2012, p. 1-p. 4.
"Office Action of China Counterpart Application", issued on Aug. 7, 2013, p1-p5, in which the listed references were cited.

* cited by examiner

*Primary Examiner* — Kenneth Parker
*Assistant Examiner* — John Lin
(74) *Attorney, Agent, or Firm* — Jianq Chyun IP Office

(57) ABSTRACT

A dished micro-bump structure with self-aligning functions is provided. The micro-bump structure takes advantage of the central concavity for achieving the accurate alignment with the corresponding micro-bumps.

6 Claims, 7 Drawing Sheets

US 8,575,754 B2

MICRO-BUMP STRUCTURE

CROSS-REFERENCE TO RELATED APPLICATION

This application claims the priority benefit of Taiwan Patent Application serial No. 98145816, filed on Dec. 30, 2009. The entirety of the above-mentioned patent application is hereby incorporated by reference herein and made a part of this specification.

BACKGROUND

1. Technical Field

The present disclosure generally relates to a bump structure, and more particularly, to a micro-bump structure having self-aligning functions.

2. Description of Related Art

During the applications of fine-pitch micro-bump packages, due to (1) the poor alignment capability of the apparatus, (2) low uniformity of the bump, (3) insufficient tin amount in the bump or (4) inferior soldering properties of the bump, misalignment or alignment shifting often occurs, which seriously deteriorates the bonding ability of the bump.

Because the fine-pitch micro-bumps have much less tin amount than the flip-chip bumps, it is unlikely for the shifted bumps (or connections) to move back to the predetermined positions following the capillary effects of the solders, even going through multiple times of reflow treatments.

Practically, the industry is keen to see whether further solutions can be provided to increase the alignment accuracy or to solve the alignment shifting problems, so that the bonding strength and the reliability of the micro-connections are improved.

SUMMARY

Accordingly, the present disclosure is directed to a micro-bump structure with self-aligning functions. The micro-bump structure takes advantage of the central concavity for achieving the accurate alignment with the corresponding micro-bumps in the package structures.

The present disclosure provides a bump structure, comprising at least a bonding pad disposed on a semiconductor substrate, a protection layer, a ring-shaped metal layer and a centrally-concave metal structure. The protection layer is disposed on the bonding pad and partially covering the bonding pad. The ring-shaped metal layer is disposed within an opening of the protection layer, at least covering sidewalls of the opening and a portion of the protection layer surrounding the opening. In addition, the centrally-concave metal structure is disposed on the ring-shaped metal layer, disposed in a hollow of the ring-shaped metal layer and partially covers the ring-shaped metal layer. The metal structure comprises at least a seed layer disposed on the ring-shaped metal layer, a metal under-layer disposed on the seed layer and a solder material layer disposed on the metal under-layer.

The present disclosure also provides a bump structure, comprising at least a bonding pad disposed on a semiconductor substrate, a protection layer, a seed layer and a ring-shaped metal structure. The protection layer is disposed on the bonding pad and has a ring-shaped opening to expose a portion of the bonding pad. The seed layer is disposed within the ring-shaped opening of the protection layer and conformally covers sidewalls and a bottom surface of the ring-shaped opening and a portion of the protection layer surrounding the ring-shaped opening. The ring-shaped metal structure is disposed on the seed layer, and the ring-shaped metal structure comprises at least a metal under-layer disposed on the seed layer, a metal layer disposed on the metal under-layer and a solder material layer disposed on the metal layer.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION

Figure 1A:
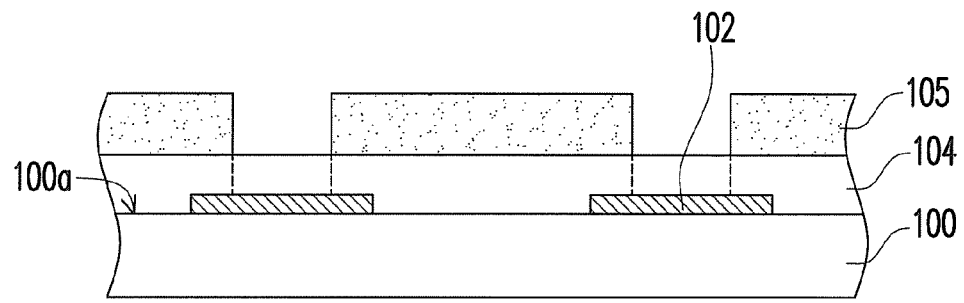
FIGS. 1A-1E are schematic cross-section views showing the manufacturing process steps of a bump structure according to one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIGS. 1A-1E are schematic cross-section views showing the manufacturing process steps of a bump structure according to one embodiment of the present disclosure.

As shown in FIG. 1A, a substrate 100 is provided. The substrate 100 can be a semiconductor wafer or chip, for example. The substrate 100 has a plurality of bonding pads 102 (only two exemplary bonding pads are shown) and a protection layer 104 disposed on the active surface 100a of the substrate 100. A patterned photoresist layer 105 is formed on the protection layer 104. The material of the bonding pad can be aluminium, for example.

Figure 1B:
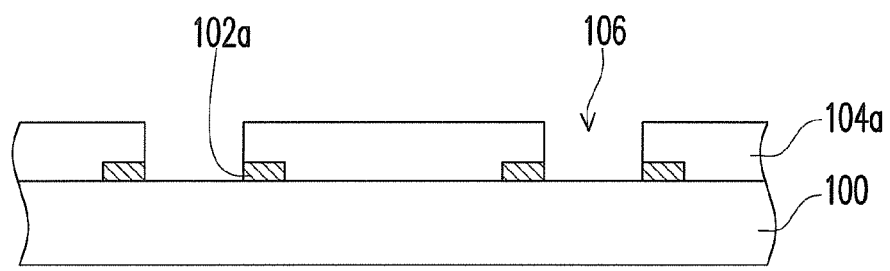

Referring to FIG. 1B, an etching process is performed using the patterned photoresist layer 105 as a mask, so that a plurality of openings 106 are formed in the protection layer 104 and the bonding pads 102. The patterned protection layer 104a and the patterned bonding pads 102a expose a portion of the substrate 100. The depth of the opening 106 can be about 5-50 microns, for example, and the shape of the opening 106 is not limited to be round, but can be square, rectangular or polygonal. The size of the opening 106 can be adjusted according to the size of the bonding pad or the corresponding bump. The etching process can etch the protection layer 104 and the bonding pad 102 in two-stage or in one single process. The etching process comprises an anisotropic etching process, for example. Later, the patterned photoresist layer 105 is removed.

Figure 1C:
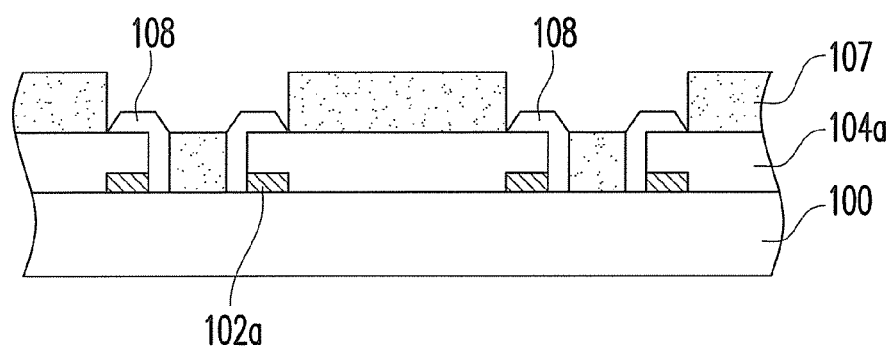

Referring to FIG. 1C, after another patterned photoresist layer 107 is formed on the protection layer 104a and over the substrate 100, a metal layer 108 is formed to cover the sidewalls of the opening 106 and a part of the protection layer 104a surrounding the opening 106. The metal layer 108 can be a nickel layer or a nickel alloy layer formed by electroless plating, for example, having a thickness of about 3-5 microns. Form the top view, the metal layer 108 is a ring-shaped structure that covers the sidewalls and the top edge of the opening 106, but the hollow of the ring-shaped structure exposes a part of the substrate 100.

Figure 1D:
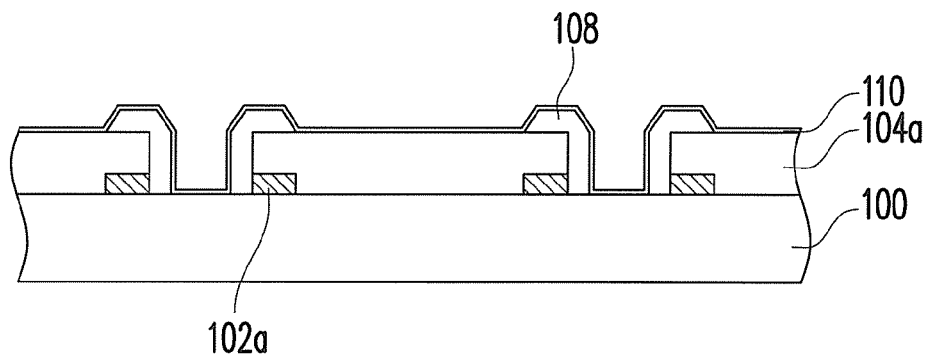

Referring to FIG. 1D, after removing the patterned photoresist layer 107, a seed layer 110 is completely faulted over the substrate 100 to cover the metal layer 108, the protection layer 104a and the exposed substrate 100. The material of the seed layer 110 can be titanium, a titanium-tungsten alloy, a titanium-tungsten-copper alloy, a titanium-copper alloy or chromium. However, this seed layer may be optional.

Figure 1E:
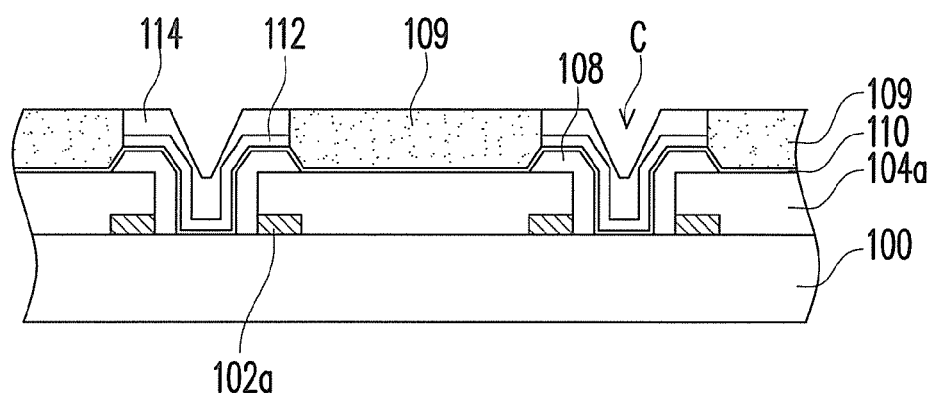

Referring to FIG. 1E, after forming a patterned photoresist layer 109 on the seed layer 110 to expose the seed layer 110 around the openings 106, a metal under-layer 112 and a solder material layer 114 are sequentially formed on the exposed seed layer 110. For example, the metal under-layer 112 can be formed by sputtering or electroplating, having a thickness of about 3 μm, and the material of the metal under-layer 112 can be copper or nickel-copper alloys. For example, the solder material layer 114 can be formed by electroplating with a thickness of about 5-10 μm, and the material of the solder material layer 114 can be tin, tin-silver alloys or tin-lead alloys. Owning to the existence of the openings 106, there is a cavity C within the opening 106 from the height differences of the subsequently formed metal layer 108, seed layer 110, metal under-layer 112 and solder material layer 114 around the openings 106. Depending on the depth of the opening 106 and the thickness of the subsequently formed layers, the depth of the cavity C can be about 10 μm and the cavity C is generally located at the centre of the opening 106. Of course, the depth and the shape of the cavity can be variable based on the design requirements. Because of the existence of the cavity C, the metal under-layer 112 and solder material layer 114 look like a centrally-concave dish structure.

In the following package process, the micro-connections (micro-bumps) of other chips can fit into the cavity C for better alignment. In the self-aligning way, better electrical connections and larger binding strength can be achieved.

The above process steps are merely exemplary, but are not intended to limit the scope of the present disclosure herein. The sequences and the conditions of the above process steps can be varied or adjusted based on the device design or manufacturing requirements.

Figure 2A:
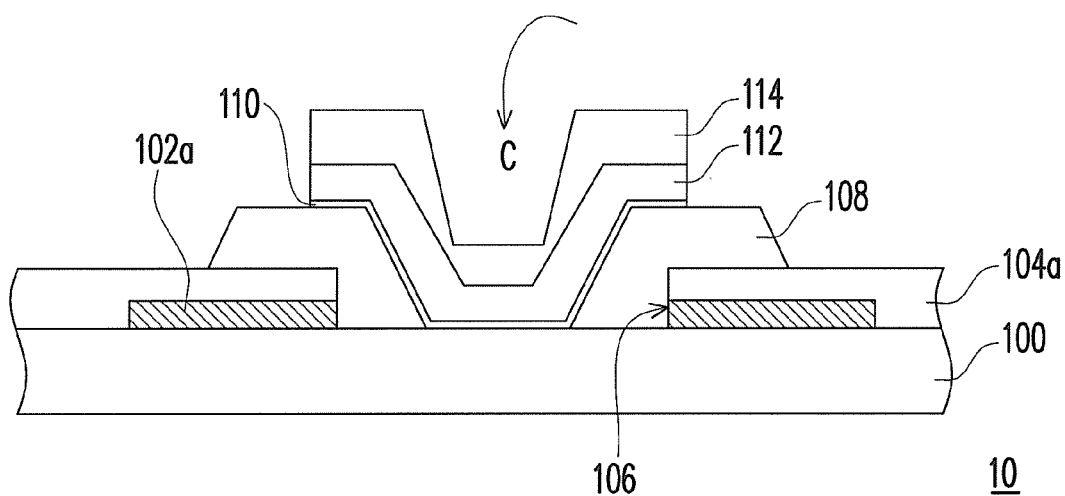
FIG. 2A is a schematic cross-section view showing a bump structure according to one embodiment of the present disclosure.
Figure 2B:
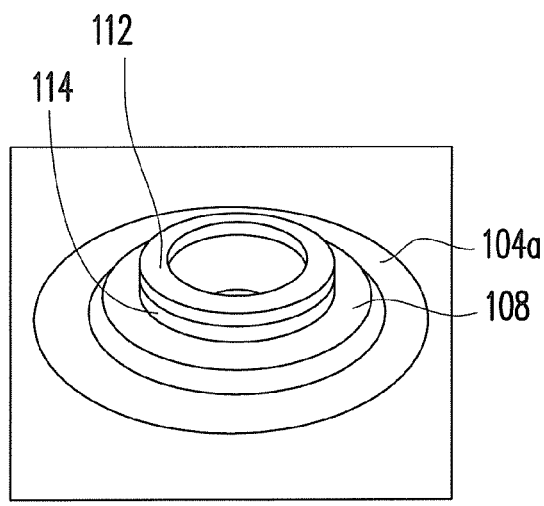
FIG. 2B is a schematic three-dimensional view showing the bump structure according to one embodiment of the present disclosure.

FIG. 2A is a schematic cross-section view showing a bump structure according to one embodiment of the present disclosure. FIG. 2B is a schematic three-dimensional view showing the bump structure according to one embodiment of the present disclosure.

Referring to FIGS. 2A-2B, the bump structure 10 on the substrate 100 includes ring-shaped bonding pads 102a, the protection layer 104a, the ring-shaped metal layer 108, the seed layer 110, the metal under-layer 112 and the solder material layer 114. The protection layer 104a covers the ring-shaped bonding pads 102a. The ring-shaped metal layer 108 is disposed within the opening 106 of the protection layer 104a and the bonding pad 102a, and covers the sidewalls and the top edge of the opening 106. The hollow of the ring-shaped metal layer 108 exposes a portion of the substrate 100. The seed layer 110 is disposed on the ring-shaped metal layer 108 to partially cover the ring-shaped metal layer 108 and covers the substrate 100 that is exposed by the hollow of the ring-shaped metal layer 108. The dish structure constituted by the metal under-layer 112 and the solder material layer 114 is disposed on the seed layer 110. There is a cavity C located within the opening 106, resulting from the height differences of the subsequently formed metal layer 108, seed layer 110, metal under-layer 112 and solder material layer 114 around the opening 106. In this case, the metal under-layer 112 and the solder material layer 114 constitute a centrally-concave dish-shaped metal structure that fits to the centrally-hollow ring-shaped metal layer 108.

As described above, the round opening 106 is merely an example, and the shape of the opening 106 can be square or polygonal.

Figure 3A:
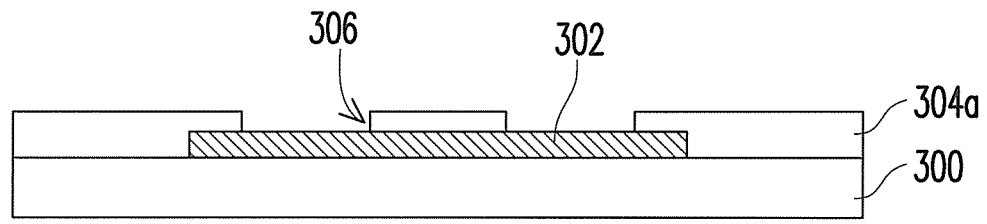
FIGS. 3A-3B are schematic cross-section views showing the manufacturing process steps of a bump structure according to another embodiment of the present disclosure.
Figure 3B:
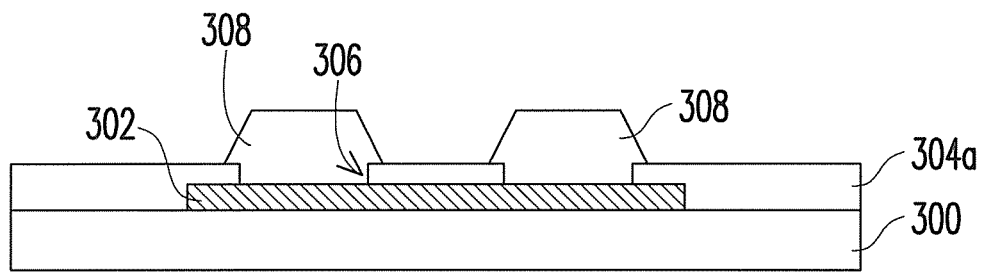

FIGS. 3A-3B are schematic cross-section views showing the manufacturing process steps of a bump structure according to another embodiment of the present disclosure. According to another embodiment of this disclosure, subsequent to the process step of FIG. 1A, as shown in FIG. 3A, using the patterned photoresist layer as an etching mask, the protection layer 304 is patterned to expose the bonding pads 302 (only one bonding pad is shown). That is, the protection layer 304 is patterned into a patterned protection layer 304a having a plurality of ring-shaped openings 306 (only one opening is shown). The shape of the opening 306 can be a round ring, square ring or polygonal rings. Later, a metal layer 308 is formed within the ring-shaped opening 306 and on the protection layer 304a, covering the sidewalls of the ring-shaped opening 306 and the protection layer 304a that surrounds the opening 306. The bonding pad 302 exposed by the patterned protection layer 304a is covered by the metal layer 308. The metal layer 308 can be a nickel layer or a nickel alloy layer Ruined by electroless plating, for example, having a thickness of about 3-5 μm. From the top view, the metal layer 308 is a ring-shaped structure that covers the sidewalls and the top edge of the opening 306, but the hollow of the ring-shaped structure exposes a part of the protection layer 304a. Following the process steps similar to the process steps described in FIGS. 1D-1E, a bump structure is obtained.

Figure 4A:
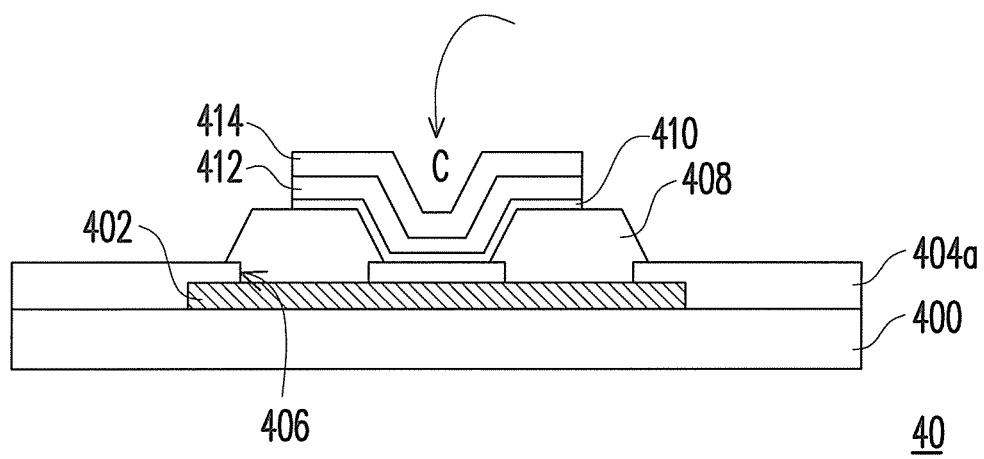
FIG. 4A is a schematic cross-section view showing a bump structure according to another embodiment of the present disclosure.
Figure 4B:
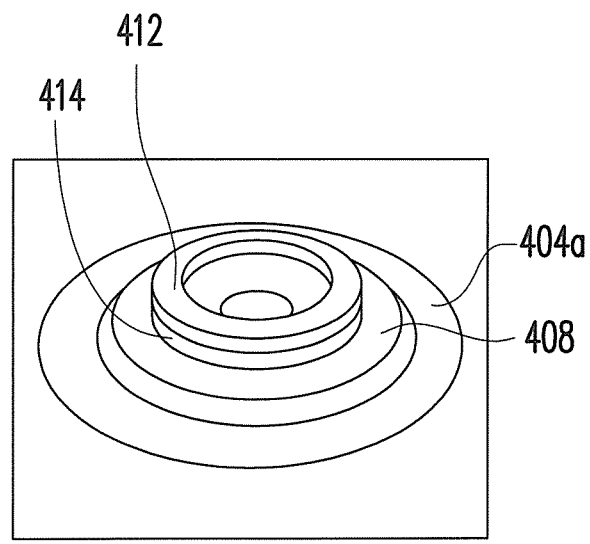
FIG. 4B is a schematic three-dimensional view showing the bump structure according to another embodiment of the present disclosure.

FIG. 4A is a schematic cross-section view showing a bump structure according to another embodiment of the present disclosure. FIG. 4B is a schematic three-dimensional view showing the bump structure according to another embodiment of the present disclosure.

Referring to FIGS. 4A-4B, the bump structure 40 on the substrate 400 includes a plurality of bonding pads 402, the protection layer 404a, the ring-shaped metal layer 408, the seed layer 410, the metal under-layer 412 and the solder material layer 414. The protection layer 404a is disposed on the bonding pads 402 to expose a portion of the bonding pads 402. The ring-shaped metal layer 408 is disposed within the ring-shaped opening 406 of the protection layer 404a and is disposed on the bonding pad 402. The ring-shaped metal layer 408 covers the sidewalls and the top edge of the opening 406. The hollow of the ring-shaped metal layer 408 exposes a portion of the protection layer 404a. The seed layer 410 is disposed on the ring-shaped metal layer 408 to partially cover the ring-shaped metal layer 408 and covers the protection layer 404a that is exposed by the hollow of the ring-shaped metal layer 408. The dish structure constituted by the metal under-layer 412 and the solder material layer 414 is disposed on the seed layer 410. There is a cavity C located within the opening 406, resulting from the height differences of the subsequently formed metal layer 408 around the opening 406, as well as the height differences of the seed layer 410, metal under-layer 412 and solder material layer 414. In this case, the metal under-layer 412 and the solder material layer 414 constitute a centrally-concave dish-shaped metal structure that fits to the centrally-hollow ring-shaped metal layer 408.

Herein, the central cavity of the bump structure offers self-aligning functions. For example, when the material of the protection layer 404a is polyimide (PI), the protection layer 404 can provide stress buffer and strengthen the bump structure. Alternatively, the protection layer that is disposed in the middle of the ring-shaped opening can be further modified or replaced by low-resistance metal materials (such as gold). In this way, such low-resistance region (of the low-resistance material) can effectively lower current crowding effects and enhance anti-electron-migration properties.

Figure 5A:
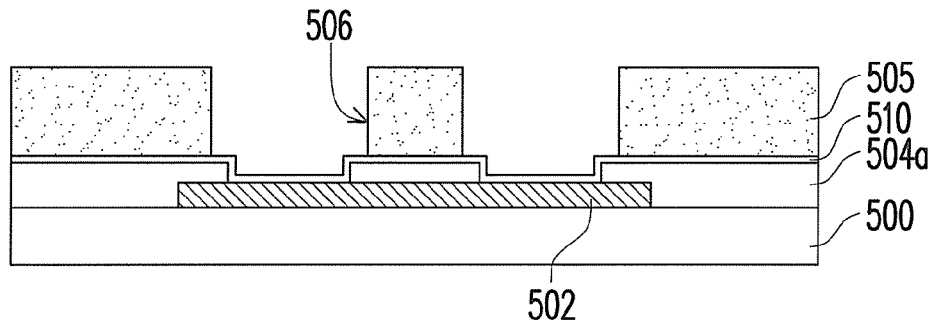
FIGS. 5A-5C are schematic cross-section views showing the manufacturing process steps of a bump structure according to another embodiment of the present disclosure.
Figure 5B:
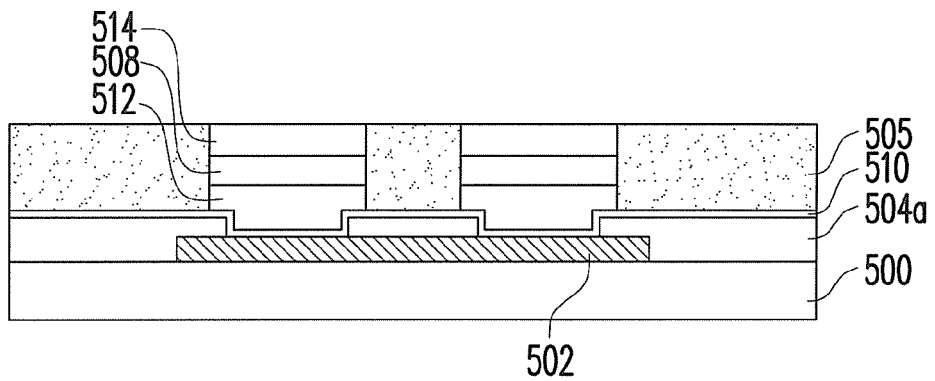
Figure 5C:
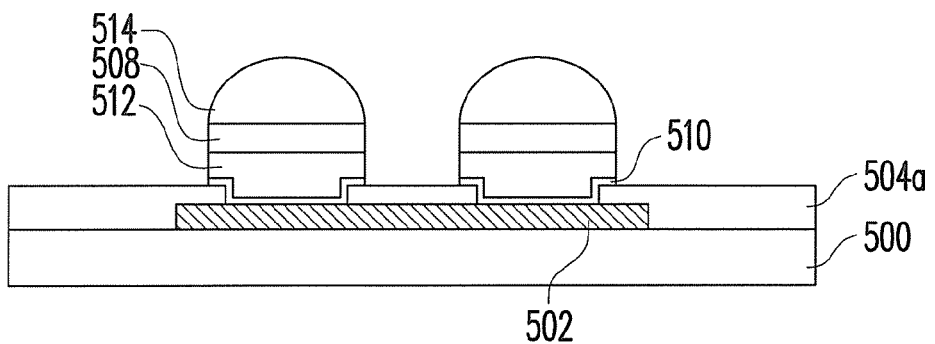

Alternatively, according to another embodiment of this disclosure, the sequence of the process steps can be altered. FIGS. 5A-5C are schematic cross-section views showing the manufacturing process steps of a bump structure according to another embodiment of the present disclosure. Following the process step of FIG. 3A, as shown in FIG. 5A, a seed layer 510 is conformally formed over the protection layer 504a, to cover the protection layer 504a and the exposed bonding pads 502, and a patterned photoresist layer 505 is formed on the seed layer 510 and over the protection layer 504a. Later, as shown in FIG. 5B, a metal under-layer 512, a metal layer 508 and a solder material layer 514 are sequentially formed within the openings 506 of the photoresist layer 505. For example, the metal under-layer 512 can have a thickness of about 3 μm, and the material of the metal under-layer 512 can be copper or nickel-copper alloys. The metal layer 508 can be a nickel layer or a nickel alloy layer formed by plating, for example, having a thickness of about 3-5 μM. For example, the solder material layer 514 can have a thickness of about 5-10 μm, and the material of the solder material layer 514 can be tin, tin-silver alloys or tin-lead alloys. From the top view, the metal under-layer 512, the metal layer 508 and the solder material layer 514 constitute a ring-shaped metal structure located within the ring-shaped opening 506.

Referring to FIG. 5C, after removing the patterned photoresist layer 505, the seed layer 510 that is not covered by the metal under-layer 512, the metal layer 508 and the solder material layer 514 is removed by etching. Later a reflow process is performed to melt the solder material layer 514, so that the surface of the solder material layer 514 becomes smooth.

Figure 6A:
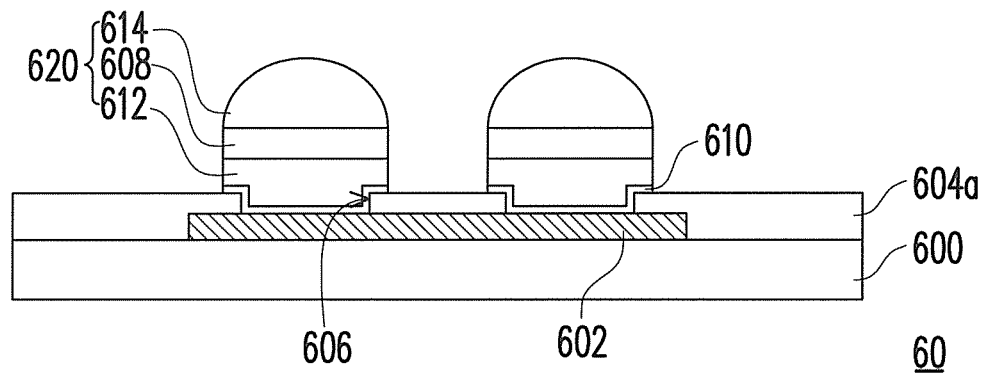
FIG. 6A is a schematic cross-section view showing a bump structure according to another embodiment of the present disclosure.
Figure 6B:
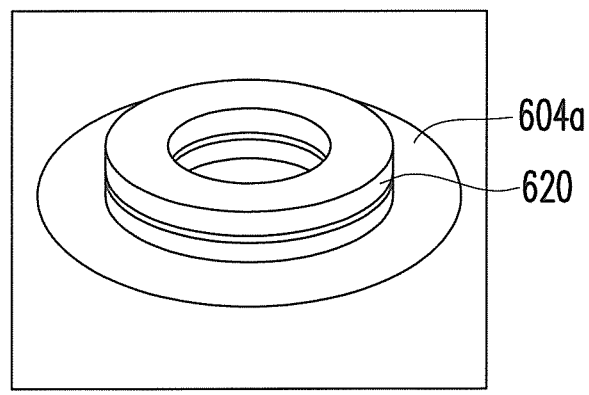
FIG. 6B is a schematic three-dimensional view showing the bump structure according to another embodiment of the present disclosure.

FIG. 6A is a schematic cross-section view showing a bump structure according to another embodiment of the present disclosure. FIG. 6B is a schematic three-dimensional view showing the bump structure according to another embodiment of the present disclosure.

Referring to FIGS. 6A-6B, the bump structure 60 on the substrate 600 includes a plurality of bonding pads 602, the protection layer 604a, and the seed layer 610, the metal under-layer 612, the metal layer 608, and the solder material layer 614 located within the openings 606 of the protection layer 604a. The protection layer 604a is disposed on the bonding pads 602 to expose a portion of the bonding pads 602. The seed layer 610 is disposed within the ring-shaped opening 606 of the protection layer 604a and is disposed on the bonding pad 602. The seed layer 610 covers the sidewalls and the top edge of the opening 606, without covering the protection layer 604a located in the middle of the ring-shaped opening 606. The ring-shaped metal structure 620 constituted by the metal under-layer 612, the metal layer 608 and the solder material layer 614 is disposed on the seed layer 610. The hollow of the ring-shaped seed layer 610 and the hollow of the ring-shaped metal structure 620 expose a portion of the protection layer 604a. There is a cavity C located in the middle of the ring-shaped metal structure 620 of the bump structure 60, resulting from the height differences of the subsequently formed metal structure 620 and the exposed protection layer 604a.

In addition, the ring-shaped metal structure 620 can be designed to have a side opening that can assist the gas release in the subsequent bonding process steps.

The micro-bump structures of the above embodiments of the present disclosure take advantage of the central concavity for achieving the accurate alignment with the corresponding micro-bumps in the following bonding processes. In this way, the micro-bump structures can achieve self-alignment, improve bonding strength and further increase the product reliability. Additionally, the described manufacturing process steps are compatible with the present manufacturing processes. Hence, there is no need for additional process steps or special materials, and the product costs won't be increased. Nevertheless, as the process steps and/or the design of the patterns can be adjusted or modified according to the product requirements, the micro-bump structures can be fabricated with better design flexibility.

The micro-bump structures of the above embodiments of the present disclosure are suitably applicable for high density or fine-pitch (for example, less than 50 microns) bonding structure, and offer better alignment accuracy and enhanced bonding strength. Additionally, the micro-bump structures of the above embodiments of the present disclosure are suitably applicable for the package structures with fine-pitch micro-connections, multi-chip stacked package structures or high bonding density package structures.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A bump structure, applicable for package structures, comprising:
   at least a bonding pad, disposed on a semiconductor substrate, wherein the bonding pad is ring-shaped and has a central hollow;
   a protection layer, disposed on the bonding pad and on the semiconductor substrate and partially covering the bonding pad;
   a ring-shaped metal layer, disposed within an opening of the protection layer, wherein the ring-shaped metal layer at least covers sidewalls of the opening and a portion of the protection layer surrounding the opening, the ring-shaped metal layer has a hollow and a portion of the semiconductor substrate is exposed through the hollow of the ring-shaped metal layer and the central hollow of the bonding pad; and
   a centrally-concave metal structure, disposed on the ring-shaped metal layer, disposed in the hollow of the ring-shaped metal layer and the central hollow of the bonding pad and covering the exposed portion of the semiconductor substrate and partially covering the ring-shaped metal layer, wherein the metal structure comprises at least a seed layer disposed on the ring-shaped metal layer, a metal under-layer disposed on the seed layer and a solder material layer disposed on the metal under-layer, and the seed layer, the metal under-layer and the solder material layer are centrally concave.

2. The bump structure of claim 1, wherein a material of the ring-shaped metal layer comprises nickel or a nickel alloy.

3. The bump structure of claim 1, wherein a material of the seed layer comprises titanium, a titanium-tungsten alloy, aluminium or chromium.

4. The bump structure of claim 1, wherein a material of the metal under-layer comprises copper or a nickel-cooper alloy.

5. The bump structure of claim 1, wherein a material of the solder material layer comprises tin, a tin-lead alloy or leadless alloys.

6. The bump structure of claim 1, wherein a material of the protection layer is polyimide or BCB polymer.

* * * * *